(12) United States Patent
Suzuki et al.

(10) Patent No.: US 7,498,907 B2
(45) Date of Patent: Mar. 3, 2009

(54) TRANSMISSION LINE SUBSTRATE AND SEMICONDUCTOR PACKAGE

(75) Inventors: Takuya Suzuki, Tokyo (JP); Teruo Furuya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 237 days.

(21) Appl. No.: 11/631,108

(22) PCT Filed: Jun. 24, 2005

(86) PCT No.: PCT/JP2005/011649

§ 371 (c)(1),
(2), (4) Date: Dec. 28, 2006

(87) PCT Pub. No.: WO2006/001388

PCT Pub. Date: Jan. 5, 2006

(65) Prior Publication Data

US 2007/0200204 A1    Aug. 30, 2007

(30) Foreign Application Priority Data

Jun. 28, 2004    (JP) .............................. 2004-190315

(51) Int. Cl.
*H01P 1/00* (2006.01)
(52) U.S. Cl. ......................................... 333/247; 333/12
(58) Field of Classification Search ................. 333/125, 333/246, 247, 12, 81 R, 81 A, 167
See application file for complete search history.

(56) References Cited

U.S. PATENT DOCUMENTS

| 3,916,353 | A | * | 10/1975 | Halberstein | ................ 333/81 R |
| 4,438,415 | A | * | 3/1984 | Hopfer | ....................... 333/81 A |
| 5,075,647 | A | * | 12/1991 | Petter | .......................... 333/121 |
| 5,821,815 | A | * | 10/1998 | Mohwinkel | .................. 330/286 |
| 6,028,494 | A | * | 2/2000 | May et al. | ....................... 333/1 |

FOREIGN PATENT DOCUMENTS

| JP | 3 113506 | 11/1991 |
| JP | 5 110301 | 4/1993 |
| JP | 6 334431 | 12/1994 |
| JP | 2003 204203 | 7/2003 |
| JP | 2004 39739 | 2/2004 |
| JP | 2004 56441 | 2/2004 |

* cited by examiner

*Primary Examiner*—Robert Pascal
*Assistant Examiner*—Gerald Stevens
(74) *Attorney, Agent, or Firm*—Oblon, Spivak, McClelland, Maier & Neustadt, P.C.

(57) ABSTRACT

A transmission line substrate includes a spurious-wave suppression circuit in which a divider divides a signal line of a driving control signal connected to a semiconductor device into two signal lines of the same phase. A delay unit is connected to one of the two signal lines, and includes a signal line with a length of substantially one half of an in-substrate effective wavelength of a spurious wave. Two parallel lines that include two parallel signal lines, on which spurious waves are in opposite phases, are connected to the delay unit and the other one of the two signal lines, respectively. A resistor is arranged on the two parallel lines, and connects between the two parallel signal lines. A combiner includes a signal line that combines the two parallel signal lines, and outputs a combined signal to the outside.

21 Claims, 11 Drawing Sheets

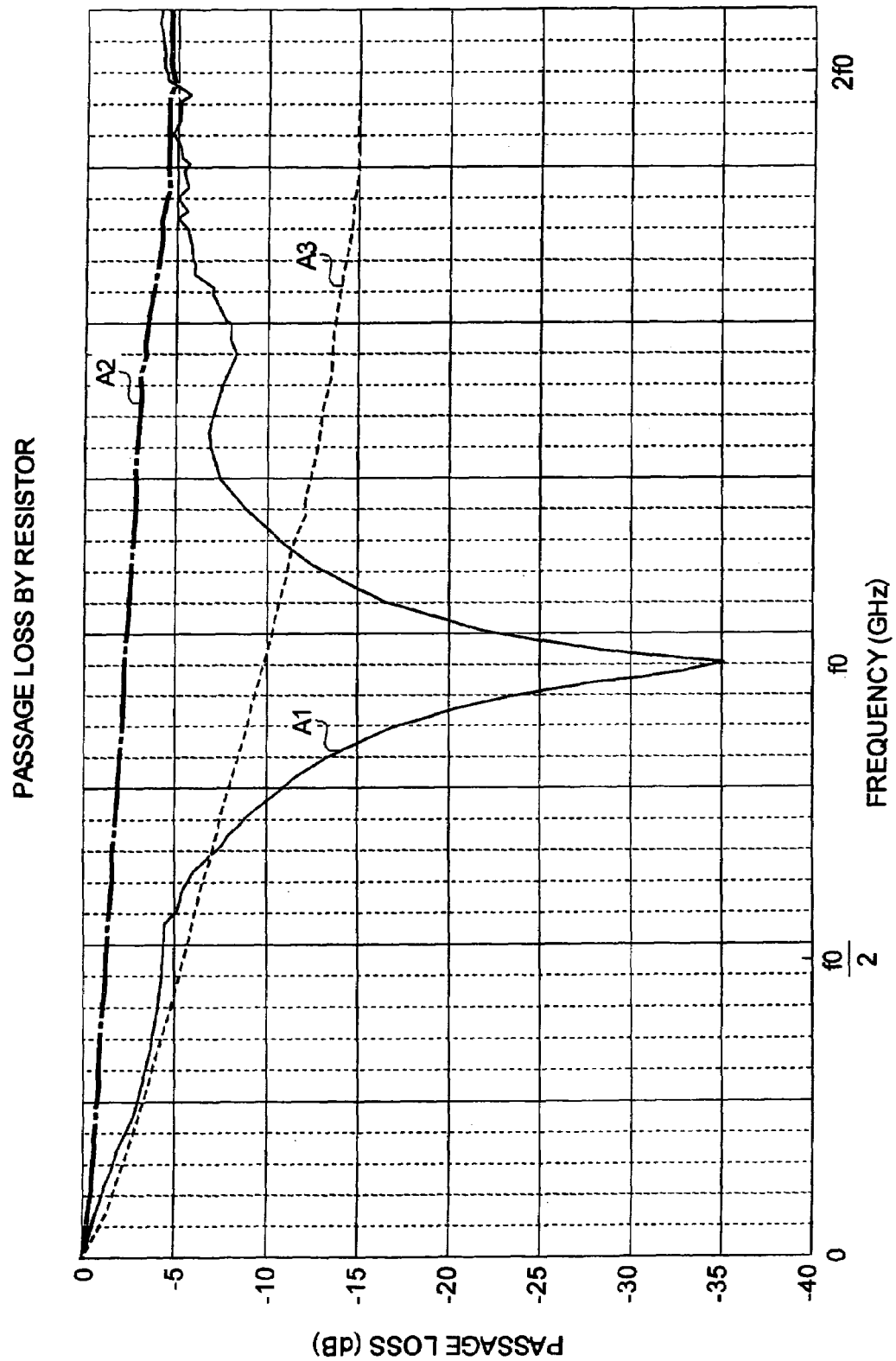

SURFACE C

SURFACE B (WITHOUT RESISTOR)

SURFACE B (WITH RESISTOR)

TRANSMISSION LINE SUBSTRATE AND SEMICONDUCTOR PACKAGE

TECHNICAL FIELD

The present invention generally relates to a transmission line substrate that transmit a signal input to and output from a semiconductor device that operates in a high-frequency band such as a microwave band or a millimeter-wave band, and a semiconductor package. The present invention specifically relates to a transmission line substrate and a semiconductor package capable of efficiently suppressing leakage of a high-frequency signal generated in a semiconductor device to the outside of the package.

BACKGROUND ART

In a high-frequency package mounted with a semiconductor device that operates in a high-frequency band such as a microwave band or a millimeter-wave band, a surface-layer signal line or an inner-layer signal line formed in a multilayer dielectric substrate connects between an external terminal formed in the high-frequency package and an input and output terminal of the semiconductor device. Through these lines, a desired high-frequency signal is input and output, and also a direct current (DC) bias voltage and a control signal are input to and output from the semiconductor device.

In the high-frequency package, the semiconductor device that operates in the high-frequency band is shielded by a cover, a sealing, and a ground conductor surface. However, a high-frequency signal (unnecessary signal) as a spurious wave that leaks by conduction from the input and output terminal of the semiconductor device is emitted to the outside via a signal line for inputting and outputting a DC bias voltage and a control signal. Therefore, in a high-frequency package of this kind, it is very difficult to satisfy the electromagnetic interference (EMI) standards of various radio laws.

The entire machine module including such a high-frequency package may be covered with a metal cover. However, this requires an expensive casing and the like. Therefore, to minimize the cost, the EMI standards should desirably be satisfied in the high-frequency package.

Patent Document 1 discloses a conventional technology for absorbing an unnecessary high-frequency signal in a circuit board with a high-frequency component mounting part, a high-frequency transmission line connected to a high-frequency terminal of a high-frequency component, and a power supply circuit connected to a power supply terminal of the high-frequency component formed on the surface of a dielectric substrate. In the conventional technology, a power supply line and a via-hole conductor in the power supply circuit are formed with a high-permeability low-resistor having a relative magnetic permeability equal to or larger than 80, an electric resistivity equal to or less than 1.0 (μΩm), and including at least one of Fe, Co, and Ni.

Patent Document 1: Japanese Patent Application Laid-open No. 2004-39739

DISCLOSURE OF INVENTION

Problem to be Solved by the Invention

According to the conventional technology, however, a resistor is connected in series to the inner-layer signal line, and it is not considered to attenuate and absorb only a spurious wave propagating through the inner-layer signal line. Therefore, when a DC bias passes through the inner-layer signal line, a voltage drop to some extent occurs, which adversely affects transmission characteristics of the DC bias.

It is therefore an object of the invention to provide a transmission line substrate and a semiconductor package capable of suppressing leakage of an unnecessary component to the outside in the high-frequency package as well as efficiently attenuating and absorbing the power of a spurious wave without adversely affecting transmission characteristics of a necessary DC bias voltage, a control signal, an intermediate-frequency signal, and the like.

Means for Solving Problem

To overcome the above problems and achieves the object mentioned above, according to the present invention, a transmission line substrate that transmits a signal input to and output from a semiconductor device, and includes a spurious-wave suppression circuit. The spurious-wave suppression circuit includes a divider that divides a signal line connected to the semiconductor device into two signal lines of the same phase, a delay unit that is connected to one of the two signal lines and has a signal line with a length of substantially one half of an in-substrate effective wavelength of a spurious wave, parallel two lines that are connected to the delay unit and the other of the two signal lines and have parallel two signal lines on which spurious waves are in opposite phases, a resistor that is arranged on the parallel two lines and connects between the parallel two signal lines, and a combiner that combines the two signal lines of the parallel two lines.

That is, according to the present invention, the delay unit sets the phases of spurious waves transmitted on the parallel two lines to opposite phases, thereby forming an electric field between the parallel two lines. The resistor is provided in parallel with the direction of the electric field on the parallel two lines.

Effect of the Invention

According to the present invention, a delay unit sets the phases of spurious waves transmitted on parallel two lines to opposite phases, thereby forming an electric field between the parallel two lines, and a resistor is provided in parallel with the direction of the electric field on the parallel two lines. Therefore, a voltage drop is generated in only an unnecessary band, and only the unnecessary band can be efficiently attenuated and absorbed without adversely affecting transmission characteristics of driving control signals such as a control signal, an intermediate-frequency signal, and a DC bias voltage.

BRIEF DESCRIPTION OF DRAWINGS

FIG. 7 is a graph of transmission characteristics of the spurious-wave suppression circuit and the like according to the first embodiment.

EXPLANATIONS OF LETTERS OR NUMERALS

Figure 1:
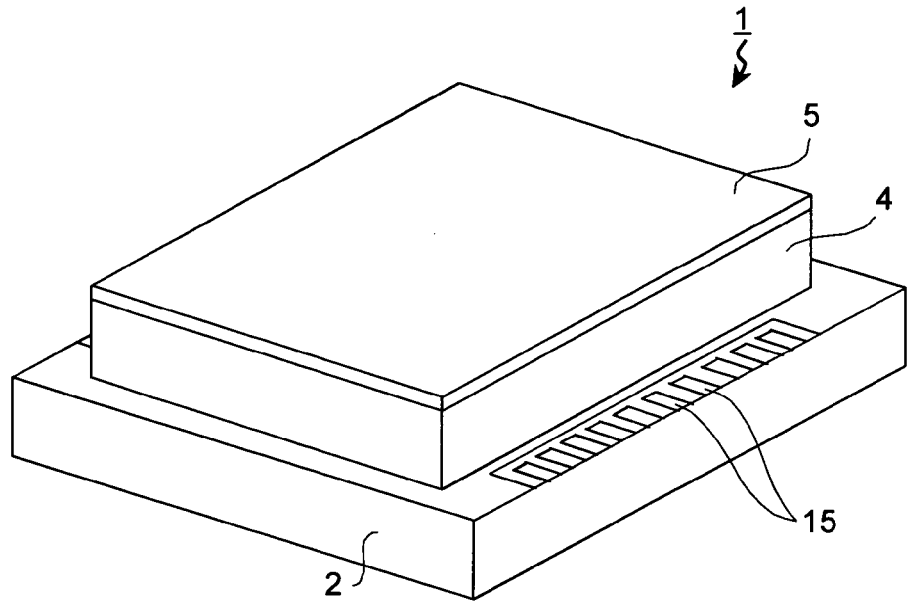
FIG. 1 is a perspective view of an appearance of a semiconductor package (high-frequency package) according to the present invention.

1, 95, 100 High-frequency package (Semiconductor package)
2 Multilayer dielectric substrate
3 High-frequency device (Semiconductor device, Semiconductor IC)
4 Seal ring
5 Cover
6 IC-mounting recess
6a Sidewall
7 Feed-through
8 Microstrip line
10 Inner conductor pad
11 Conductor pad
12 Wire
15 External conductor pad
16 Ground surface
17 Solder
18 Ground pattern
20 Carrier
30, 30b, 30c Ground via
30a Sidewall ground via
33 Cavity
35 Inner-layer grounding conductor
40, 40a, 40b Signal via
45, 45a, 45b Inner-layer signal line
50, 50a, 50b, 50c Spurious-wave suppression circuit
51 Divider
52 Delay unit
53 Parallel two line
54 Combiner
55 Resistor
60 Dielectric
70 Front open stub
75 Coupling slot
80 Resistor
85 Coupling slot
85a Slot line
90 Spurious-wave suppression circuit

BEST MODE(S) FOR CARRYING OUT THE INVENTION

Exemplary embodiments of a transmission line substrate and a semiconductor package according to the present invention are explained in detail below with reference to the accompanying drawings. Note that the present invention is not limited to the embodiments.

First Embodiment

Figure 2:
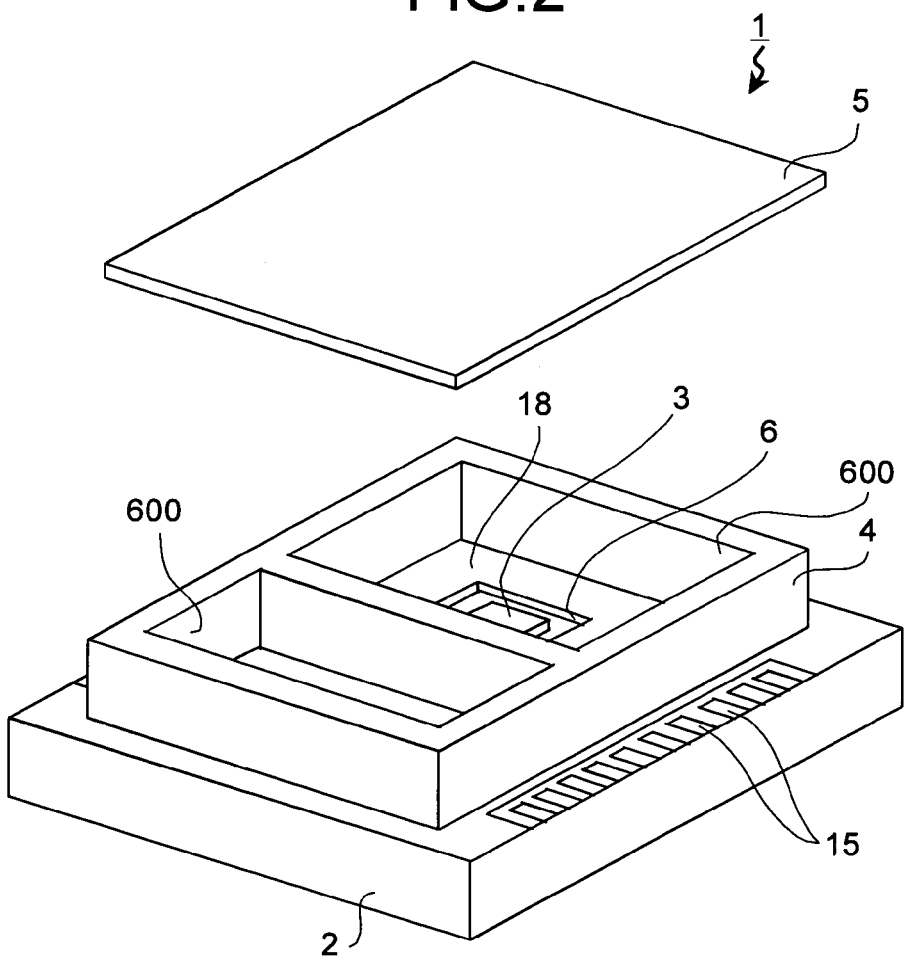
FIG. 2 is a perspective view of an appearance of the semiconductor package according to the present invention with a cover of the semiconductor package removed.
Figure 3:
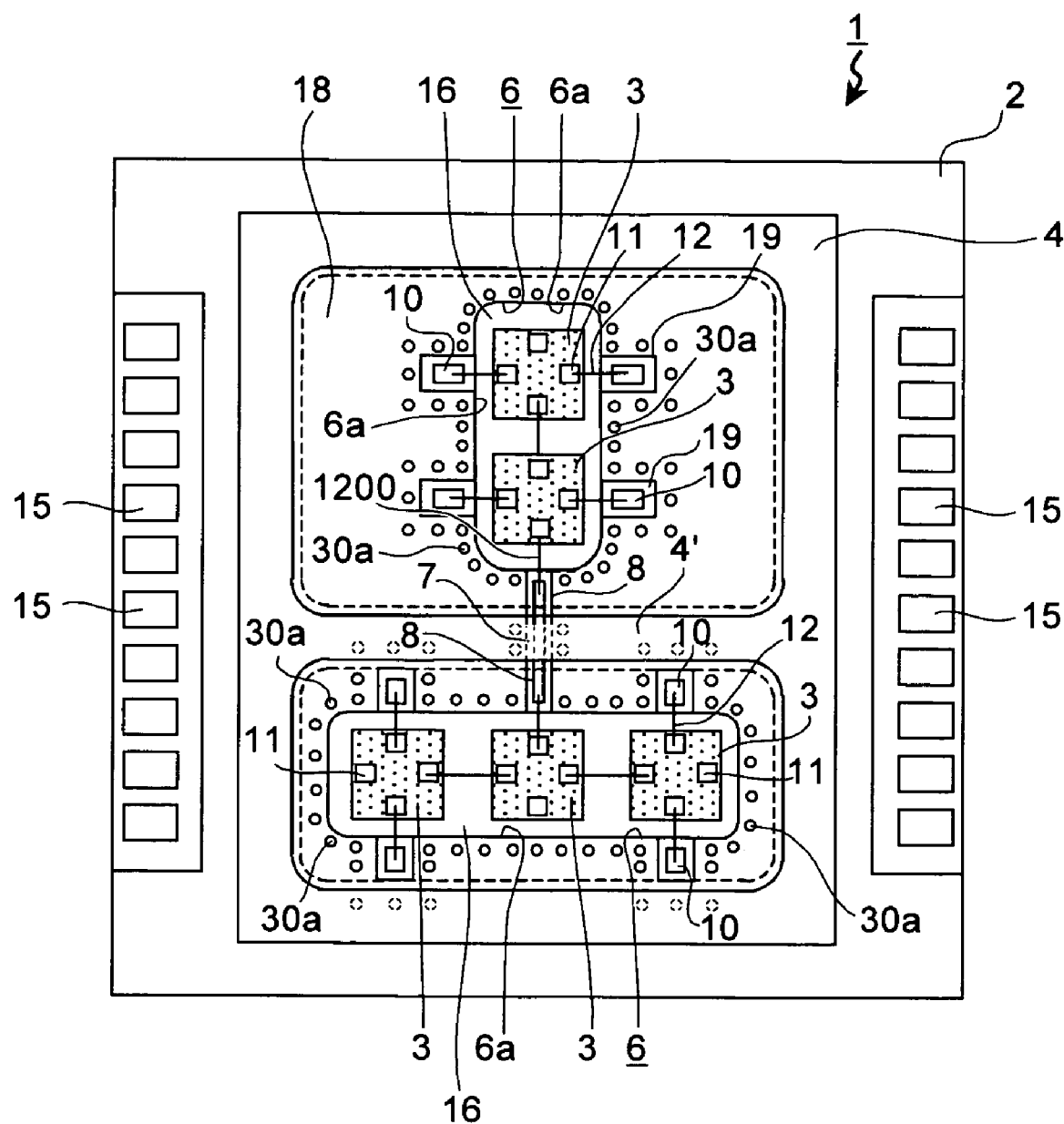
FIG. 3 is a plan view of an internal structure of the semiconductor package according to the present invention.

FIGS. 1 to 3 depict a semiconductor package 1 according to the present invention. The present invention can be applied to a semiconductor package mounted with a semiconductor device (semiconductor integrated circuit (IC)) that operates in an arbitrary frequency band. In the following description, the present invention is applied to a semiconductor package (hereinafter, "high-frequency package") 1 mounted with a plurality of high-frequency semiconductor devices (monolithic microwave integrated circuit (MMIC), hereinafter, "high-frequency device") that operate in a high-frequency band such as microwave and millimeter-wave band. The semiconductor package 1 is suitably applied to, for example, a frequency-modulation continuous-wave (FM-CW) radar.

As is known, the FM-CW radar obtains a beat frequency from a difference between a transmission wave emitted toward a target (front vehicle) and a received wave reflected from the target, and calculates a distance to the target and a relative speed using the beat frequency.

Figure 4:
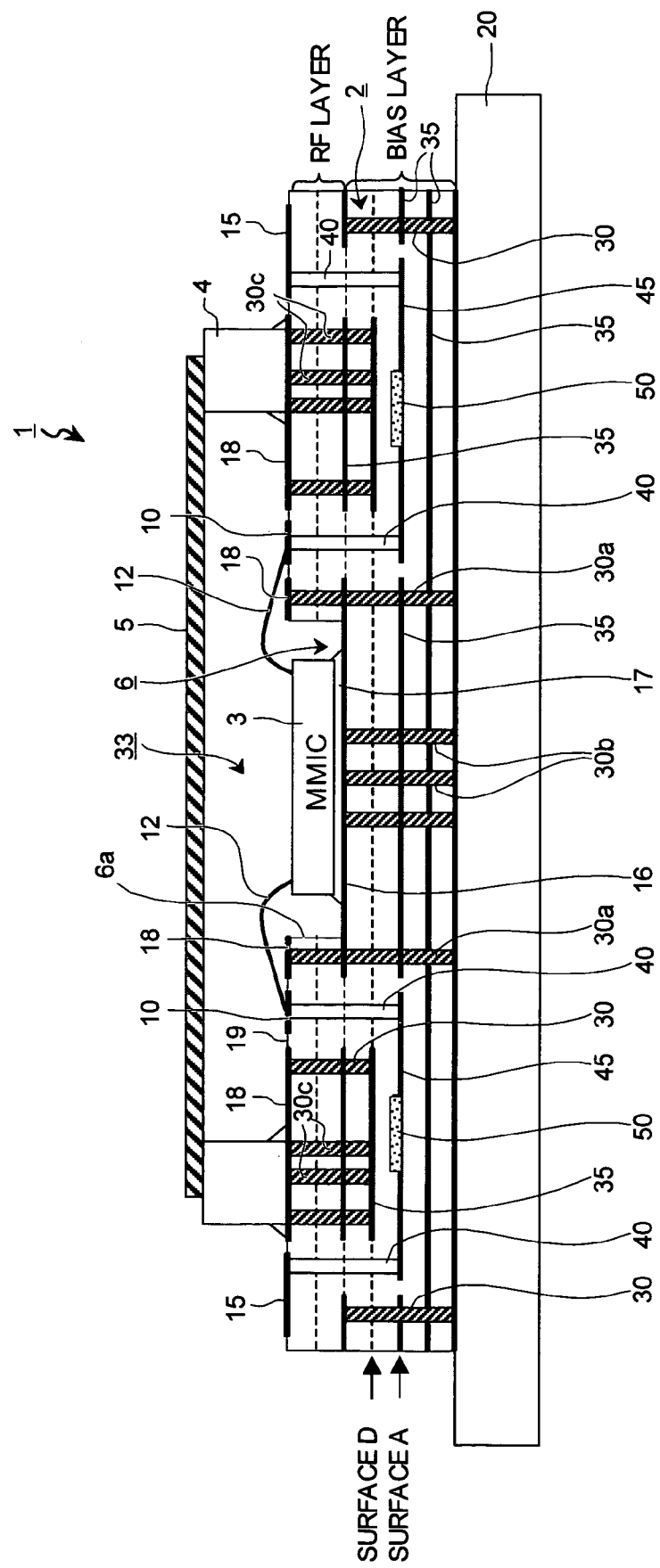
FIG. 4 is a detailed sectional view a via structure of a multilayer dielectric substrate of a semiconductor package according to a first embodiment.

In the high-frequency package 1 shown in FIGS. 1 to 3, a multilayer dielectric substrate 2 is mounted on a grounded metal carrier 20 (see FIG. 4). A frame-shaped seal ring 4 of metal is bonded airtight on the multilayer dielectric substrate 2 with by a brazing material such as solder or silver solder. A cover 5 as a lid is welded on the seal ring 4. In the example shown in FIG. 1, the seal ring 4 is a frame of a figure-eight-like shape with two through-holes (600).

By bonding the cover 5 to the seal ring 4, a plurality of high-frequency devices 3 on the multilayer dielectric substrate 2 are hermetically sealed. The seal ring 4 and the cover 5 shield unnecessary radiation from the high-frequency devices 3 on the multilayer dielectric substrate 2 to the outside. In other words, the seal ring 4 and the cover 5 constitute an electromagnetic shielding member that covers a part of the surface layer of the multilayer dielectric substrate 2 and the high-frequency devices 3. The structure of the electromagnetic shield is not limited to this, and includes various components such as a grounding conductor and a plurality of grounded vias, described later, provided on the surface and inner layers of the multilayer dielectric substrate 2.

As shown in FIGS. 2 and 3, one to a plurality of recesses (hereinafter, "IC-mounting recesses") 6 in which the high-frequency devices 3 are mounted are formed on the multilayer dielectric substrate 2. The IC-mounting recess 6 forms a cavity in the upper layers of the multilayer dielectric substrate 2. The cavity is surrounded by a sidewall 6a of the IC-mounting recess 6. A grounding conductor 16 is formed on a bottom surface (cavity bottom surface) of the IC-mounting recess. The high-frequency devices 3, such as a voltage control oscillator (VCO), an amplifier, a power divider, a multiplier, and a mixer, are accommodated in the IC-mounting recess 6. The high-frequency devices 3 are bonded to the grounding conductor 16 with a bonding material 17 such as solder, brazing material, or resin adhesive.

As shown in FIG. 3, the IC-mounting recess 6 is arranged inside each of the two through-holes 600 of the seal ring 4. The high-frequency devices 3 are arranged in the IC-mounting recess 6. A feed-through 7 is provided below a seal ring 4' that defines the two through-holes 600 of the seal ring 4. In other words, the high-frequency devices 3 in the upper IC-mounting recess 6 are connected to those in the lower IC mounting recess 6 with the feed-through 7 and a microstrip line 8. The feed-through 7 is configured to cover a signal pin or the microstrip line with a dielectric. With this arrangement, a high-frequency signal is transmitted between two IC-mounting recesses 6 while the airtight state is maintained in each IC-mounting recess 6. The microstrip line 8 is arranged on the surface layer of the multilayer dielectric substrate 2, and connected to the feed-through 7. A conductor pad in the high-frequency device 3 is connected to the microstrip line 8 with a wire 1200 by wire bonding.

A grounding conductor 18 as a surface-layer grounding conductor is provided on the surface layer of the multilayer dielectric substrate 2, and is covered by a ground surface. The grounding conductor 18 is connected to the grounding conductor 16 on the semiconductor device mounting surface through a plurality of ground vias (sidewall ground vias) 30a formed around the IC-mounting recess 6 of the multilayer dielectric substrate 2. The grounding conductor 18 has the same potential as that of the grounding conductor 16. Spacing between the sidewall ground vias 30a is set to a value less than one half of an in-substrate effective wavelength λg of a high-frequency signal, being a spurious wave, used in the high-frequency package 1. This prevents the spurious wave from entering the multilayer dielectric substrate 2 via the sidewall 6a of the IC-mounting recess 6, and an electromagnetic shield is three-dimensionally formed by the seal ring 4 and the cover 5.

A conductor pad (hereinafter, "inner conductor pad") 10 is provided on the surface of the multilayer dielectric substrate 2 inside the seal ring 4 for supplying a DC bias voltage to the high-frequency device 3 or inputting and outputting a control signal (low-frequency signal close to a DC region) and an IF signal (signal in an intermediate frequency band) output from the high-frequency device 3 to and from the high-frequency device 3. The DC bias voltage, the control signal, and the IF signal are hereinafter generally referred to as "driving control signal" for the high-frequency device 3. A driving-control-signal input/output pad (hereinafter, "conductor pad") 11 is also provided on the high-frequency device 3 side. The inner conductor pad 10 is wire-bonded to the conductor pad 11 by a wire 12 of gold or the like. A metal bump or a ribbon can be used Instead of the wire 12.

A plurality of conductor pads (hereinafter, "external conductor pads") 15 are provided as external terminals on the multilayer dielectric substrate 2 outside the seal ring 4. The external conductor pad 15 is DC-connected to the inner conductor pad 10 on the multilayer dielectric substrate 2 inside the seal ring 4 via a signal via (signal through-hole) and an inner-layer signal line, described later, formed in the multilayer dielectric substrate 2. These external conductor pads 15 are connected to the power supply circuit board, the control board, etc., not shown, via wires or the like.

FIG. 4 depicts a via structure (through-hole structure) in the multilayer dielectric substrate 2 of the high-frequency package 1. The multilayer dielectric substrate 2 is provided on the grounded metal carrier 20. In FIG. 4, vias for the driving control signals (hereinafter, "signal vias") 40, to which driving control signals such as a control signal, an interface (IF) signal, and a DC bias voltage are transmitted, are indicated outline without fill patterns, and ground vias 30 (30a, 30b, . . . ) are indicated by hatching.

In this case, the multilayer dielectric substrate 2 has a six-layer structure including first to sixth layers. The center of the first and second layers of the multilayer dielectric substrate 2 is removed to form the IC-mounting recess 6. The ground surface 16 as the surface-layer grounding conductor is formed on the bottom surface of the IC-mounting recess 6, i.e., the surface of the third layer. The high-frequency device 3 is mounted on the ground surface 16 via the solder 17 (or a conductive adhesive). The ground surface 16 arranged below the high-frequency device 3 is connected to the carrier 20 through the ground vias 30b. These ground vias also function as thermal vias to dissipate heat.

The sidewall (sidewall surface of the first and second layers of the multilayer dielectric substrate 2) 6a of the IC-mounting recess 6 is in the state that the dielectric is exposed. However, as described above, the sidewall ground vias 30a are formed around the IC-mounting recess 6 and the inner conductor pad 10. These sidewall ground vias 30a suppress the entrance of the spurious wave into the multilayer dielectric substrate 2 via the sidewall 6a. The sidewall ground vias 30a connect between the ground pattern 18 formed on the surface of the first layer of the multilayer dielectric substrate 2 and the carrier 20. While a plurality of the inner conductor pads 10 are provided on the surface of the first layer, the ground pattern 18 as the surface-layer grounding conductor is formed in a part other than a part 19 (see FIG. 3) in which the dielectrics around the inner conductor pads 10 are exposed. This prevents the spurious wave from entering in the multilayer dielectric substrate 2 via the surface layer.

As described above, the seal ring 4 is mounted on the multilayer dielectric substrate 2, and the cover 5 as a lid is provided on the seal ring 4. An airtight cavity 33 is formed where the high-frequency devices 3 are mounted on the multilayer dielectric substrate 2 by the electromagnetic shielding members such as the seal ring 4 and the cover 5. The cavity 33 is electrically shielded from the outside by the electromagnetic shielding members such as the seal ring 4 and the cover 5, the surface-layer grounding conductors such as the ground surface 16 and the ground pattern 18, and the sidewall ground vias 30a. Instead of the sidewall ground vias 30a, the sidewall 6a of the IC-mounting recess 6 can be metallized to form a ground surface on the sidewall 6a.

A plurality of (in this case, three rows) ground vias (radio-frequency (RF) shielding vias) 30c for shielding the spurious wave generated from the high-frequency devices 3 are provided immediately beneath the seal ring 4 of the multilayer dielectric substrate 2. The ground vias 30, 30a, 30b, and 30c are appropriately connected to the surface-layer grounding conductor, the grounded carrier 20, or an inner-layer grounding conductor 35 formed on the inner layer of the multilayer dielectric substrate 2. Basically, the inner-layer grounding conductor 35 is provided among all the layers as a solid ground layer.

The inner conductor pads 10 inside the seal ring 4 are connected to the external conductor pads 15 arranged outside the seal ring 4 via one to a plurality of the signal vias 40 and one to a plurality of inner-layer signal lines 45. Although not clearly shown in FIG. 4, the ground vias 30 are arranged around the signal vias 40 and the inner-layer signal lines 45 with a dielectric therebetween. Shield by the ground vias 30 suppresses radiation of spurious waves from the signal vias 40 and the inner-layer signal lines 45 and coupling of the spurious waves from the surroundings.

However, because the conductor pad 11 is DC-connected to the RF circuit in the semiconductor device 3, substantial amount of unnecessary signals that cannot be suppressed by an RF choke circuit (not shown) in the high-frequency device (semiconductor device) 3 are leaked out. The unnecessary signals are also leaked to the outside of the high-frequency package 1 through the wire 12 directly DC-connected to the conductor pad 11, the inner conductor pads 10, the signal vias 40, the inner-layer signal lines 45, and the external conductor pad 15.

There are also spurious waves that enter the multilayer dielectric substrate from where the dielectric is exposed and are coupled to the signal vias and the inner-layer signal lines. In other words, even in the shielding structure that suppresses the emission and coupling of spurious waves in the dielectric substrate, when the spurious waves from the semiconductor devices 3 are once coupled to the inner conductor pad in the shielded space, the DC bias line becomes a leakage path of the spurious waves.

Therefore, according to the first embodiment, a spurious-wave suppression circuit 50 is provided in the middle of the inner-layer signal line 45. The spurious-wave suppression circuit 50 attenuates and absorbs the spurious waves with high efficiency.

Not to affect transmission characteristics of the DC bias, a ground conductor layer is formed in the upper and lower layers of the inner-layer signal lines, and a resistor is not connected in serial to the inner-layer signal lines 45 but connected in parallel to the inner-layer signal lines 45. Specifically, a resistor is applied on the surface of the inner-layer signal lines 45. When the inner-layer signal lines constitute a triplate line or a microstrip line, usually, an electric field is formed in up and down directions toward the ground conductor layer. In this case, when a resistor is formed on a surface perpendicular to the electric field in the up and down directions, the efficiency of attenuating and absorbing the unnecessary high-frequency signals becomes considerably low. Therefore, in the first embodiment, a resistor is arranged on parallel two lines (coupled differential lines) on which opposite-phase signals flow. The resistor is thereby arranged in parallel with the direction of the electric field of the signal lines.

In the example shown in the drawings, the inner-layer signal line 45 is arranged between the inner-layer grounding conductors 35 on the upper and lower layers via the dielectric to form the triplate line. In the case of FIG. 4, the inner-layer signal lines 45 are provided between the fourth and fifth layers. Therefore, the inner-layer grounding conductors 35 are formed between the third and fourth layers and between the fifth and sixth layers, corresponding to the positions at which the inner-layer signal lines 45 are formed.

Figure 5:
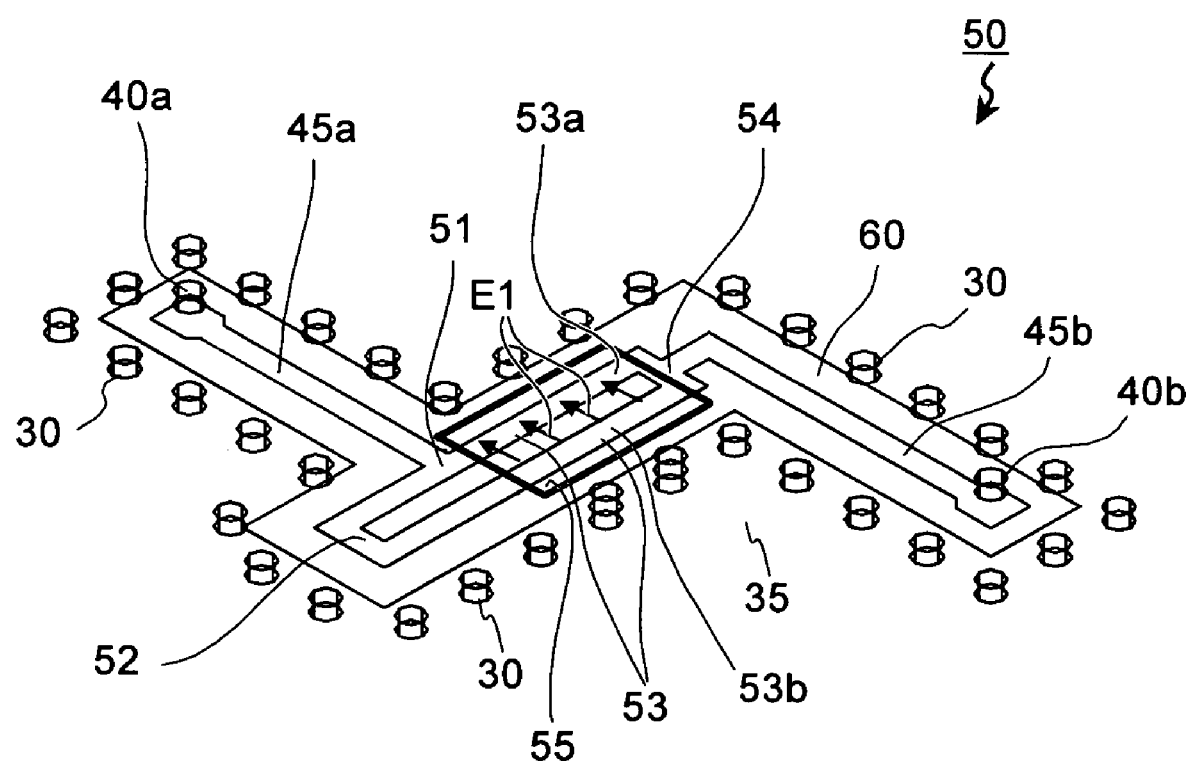
FIG. 5 is a perspective view of a structure of a spurious-wave suppression circuit according to the first embodiment mounted within the multilayer dielectric substrate.
Figure 6A:
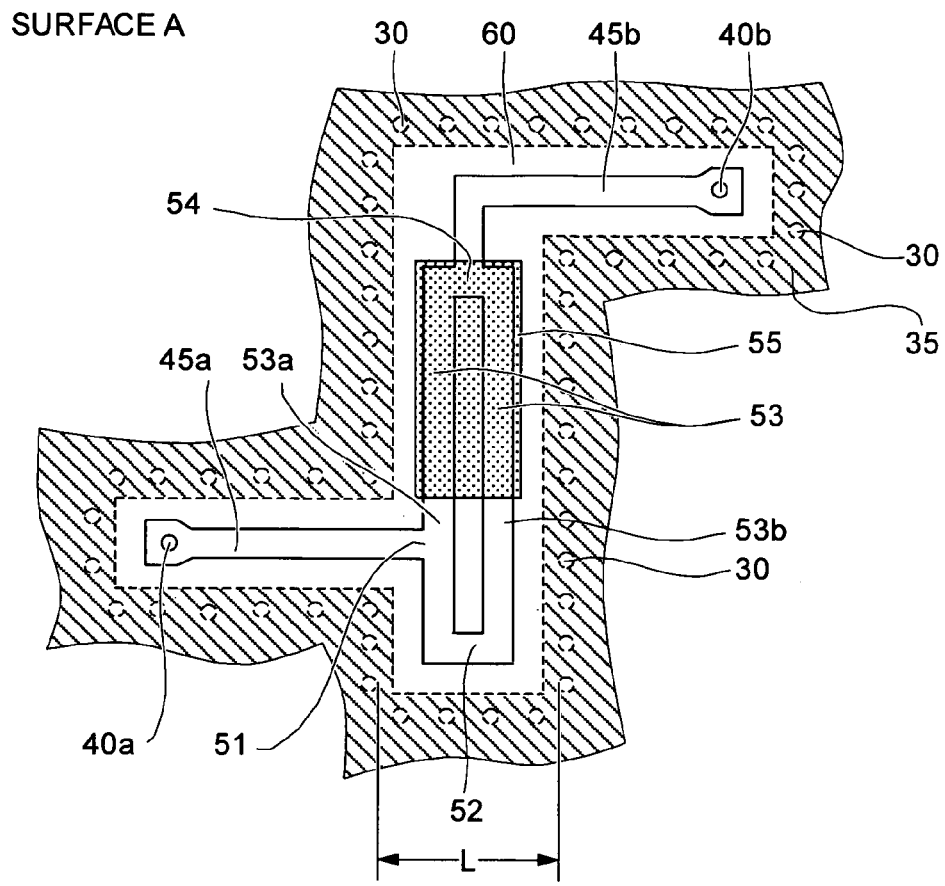
FIG. 6A is a plan view of a structure of the spurious-wave suppression circuit according to the first embodiment mounted within the multilayer dielectric substrate, depicting a state of a surface A of the multilayer dielectric substrate shown in FIG. 5.
Figure 6B:
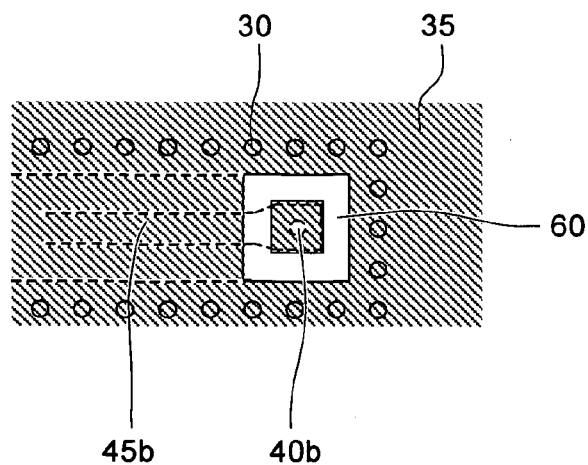
FIG. 6B is a diagram of a state of a surface D of the multilayer dielectric substrate shown in FIG. 7.

FIG. 5 is a perspective view of an example of the structure of the spurious-wave suppression circuit 50. FIG. 6A is a plan view of the structure of the spurious-wave suppression circuit 50 arranged on a surface A (between the fourth and fifth layers) of the multilayer dielectric substrate 2 in the high-frequency package 1 shown in FIG. 4. FIG. 6B depicts a state of a surface D (between the third and fourth layers) of the multilayer dielectric substrate 2.

In FIGS. 5 and 6A, one signal via 40a is connected to the inner conductor pad 10 side on the high-frequency device 3 side, and the other signal via 40b is connected to the external conductor pad 15 side. The spurious-wave suppression circuit 50 is formed between the inner-layer signal line 45a connected to the signal via 40a and the inner-layer signal line 45b connected to the signal via 40b. The spurious-wave suppression circuit 50 includes a divider (T branch) 51, a delay unit 52, parallel two lines 53, a combiner 54, and a resistor (a printed resistor) 55. The ground vias 30 are arranged around the signal vias 40a and 40b with a dielectric 60 therebetween.

The divider (T branch) 51 divides the inner-layer signal line 45a into two signal lines of the same phase. The delay unit 52 is formed on one of the signal lines obtained by the divider 51, and configured of a signal line with a length substantially one half of the in-substrate effective wavelength $\lambda g$ of a spurious wave. The parallel two lines 53 include two parallel signal lines 53a and 53b. The signal line 53a is connected to the line divided by the divider 51, and the other signal line 53b is connected to the delay unit 52. The combiner 54 includes a signal line that combines the two signal lines 53a and 53b of the parallel two lines 53 in the same phase, and outputs a combined signal to the external conductor pad 15 side. The resistor (printed resistor) 55 has volume resistivity ranging from 0.0002 to 0.1 ($\Omega \cdot m$), and is arranged on the parallel two lines 53, thereby connecting between the two signal lines 53a and 53b.

A transmission line that constitutes the divider 51, the delay unit 52, the parallel two lines 53, and the combiner 54 is configured by a triplate line in the example shown in the drawings, and the signal line is formed between the upper and lower inner-layer grounding conductors 35. In other words, as shown in FIG. 6B, the inner-layer grounding conductor 35 is formed at a position corresponding to the inner-layer signal line that constitutes the spurious-wave suppression circuit 50, between the third and fourth layers (surface D), and between the fifth and sixth layers. The ground vias 30 and the inner-layer grounding conductor 35 are arranged around the transmission line that constitutes the divider 51, the delay unit 52, the parallel two lines 53, and the combiner 54 with the dielectric 60 therebetween. Spacing between the ground vias 30 is set to equal to or less than one quarter of the in-substrate effective wavelength $\lambda g$ of the spurious wave. A distance L between the opposed ground vias 30 is set to equal to or less than one half of the wavelength $\lambda g$.

The delay unit 52 has a length substantially one half of the in-substrate effective wavelength $\lambda g$ of the spurious wave. Therefore, the delay unit 52 delays the phase of the spurious wave by approximately $\lambda g/2$. Consequently, between the two signal lines 53a and 53b of the parallel two lines 53, the phase of the spurious wave on the signal line 53a that does not pass through the delay unit 52 is advanced by $\lambda g/2$ from that of the spurious wave on the signal line 53b that passes through the delay unit 52. In other words, on the parallel two lines 53, the spurious waves are coupled in the opposite phases. As shown in FIG. 5, the signal lines 53a and 53b constitute a coupled differential line, thereby forming an electric field E1 between the signal lines 53a and 53b. The electric field E1 is most intense in the frequency band of the spurious wave (unnecessary-frequency band) corresponding to the opposite phases.

The resistor 55 is applied to connect between the two signal lines 53a and 53b on the parallel two lines 53. Therefore, the resistor 55 is arranged in parallel with the electric field E1. Thus, the resistor 55 is not arranged perpendicular to the electric field, differently from that in the conventional technique, but is arranged in parallel with the electric field E1 intentionally formed between the parallel two lines 53. Besides, the electric field E1 between the parallel two lines 53 is most intense at the frequency of the spurious waves. Therefore, in this unnecessary-frequency band, it is possible to obtain the equivalent to a circuit including a resistor connected in series to the potential difference between the parallel two lines. Consequently, a voltage can be dropped selectively in only a desired unnecessary-frequency band. In other words, the resistor 55 can efficiently attenuate and absorb the power of the spurious wave. Further, the combiner 54 combines signals on the parallel two lines 53 in the same phase from the parallel two lines. Therefore, in the unnecessary-frequency band, phases of signals are opposite due to the delay unit 52, and the signals are combined in the opposite phases. Consequently, the signals are reflected efficiently. In other words, a remaining spurious wave that cannot be absorbed by the resistor 55 can be cancelled, and a leakage to the outside can be suppressed. As explained above, the spurious-wave suppression circuit 50 has a double effect of suppressing the spurious wave: the attenuation/absorption effect in the resistor 55, and the cancellation effect by combining signals of opposite phases in the combiner 54.

As described above, the inner-layer signal line 45 is configured of the triplate line. Therefore, while the electric field in the up and down directions is formed from the inner-layer signal line 45 to the upper and lower inner-layer grounding conductors 35, the electric field E1 formed between the parallel two lines 53 is dominant with respect to the spurious wave due to the phase control. Consequently, the resistor 55 can efficiently attenuate and absorb the spurious waves. The structure of the delay unit is not limited to the above. For example, the delay unit can be configured by a three-dimensional line having a length substantially one half of the in-substrate effective wavelength $\lambda g$ of the spurious wave, including the signal vias, taking advantage of the structure of the multilayer substrate.

FIG. 7 depicts transmission characteristics of the spurious-wave suppression circuit 50. A solid line (A1) represents a transmission characteristic of the spurious-wave suppression circuit 50 when the resistor 55 has a length (length in the signal line transmission direction) of 1 millimeter. An alternate long and short dashed (A2) represents a transmission characteristic when a resistor having a length of 3.5 millimeters is simply applied on the inter-layer signal line 45. A broken line (A3) represents a transmission characteristic when a resistor having a length of 16.5 millimeters is simply applied on the inter-layer signal line 45. In FIG. 7, the unnecessary frequency to be removed is $f_0$ (GHZ). As can be seen in FIG. 7, the spurious-wave suppression circuit 50 can attenuate and absorb the spurious waves in high efficiency in the band around the frequency $f_0$ of the spurious waves using a small resistor.

As described above, according to the first embodiment, the delay unit 52 causes the phases of the spurious waves transmitted on the parallel two lines 53 to be opposite, which forms an electric field between the parallel two lines. The resistor is provided in parallel with the direction of the electric field on the parallel two lines. Thus, only the spurious waves can be attenuated and absorbed efficiently with a small resistor without affecting transmission characteristics of the driving control signals such as the control signal, the IF signal, and the DC bias voltage. Therefore, the spurious waves can be suppressed from being emitted to the outside of the high-frequency package 1. The high-frequency package as a single unit can suppress the emission of the high-frequency signals (spurious waves). Further, the combiner, which combines signals on two signal lines of the parallel two signal lines in the same phase, combines the spurious waves in a reversed-phase relationship on the parallel two lines. Consequently, only spurious frequency bands can be efficiently cancelled.

While the example that the spurious-wave suppression circuit 50 is provided on the triplate line is explained above, the spurious-wave suppression circuit 50 can be provided in the middle of the microstrip line. In this case also, spurious signals that are leaked from the microstrip line can be suppressed sufficiently.

Second Embodiment

Figure 8:
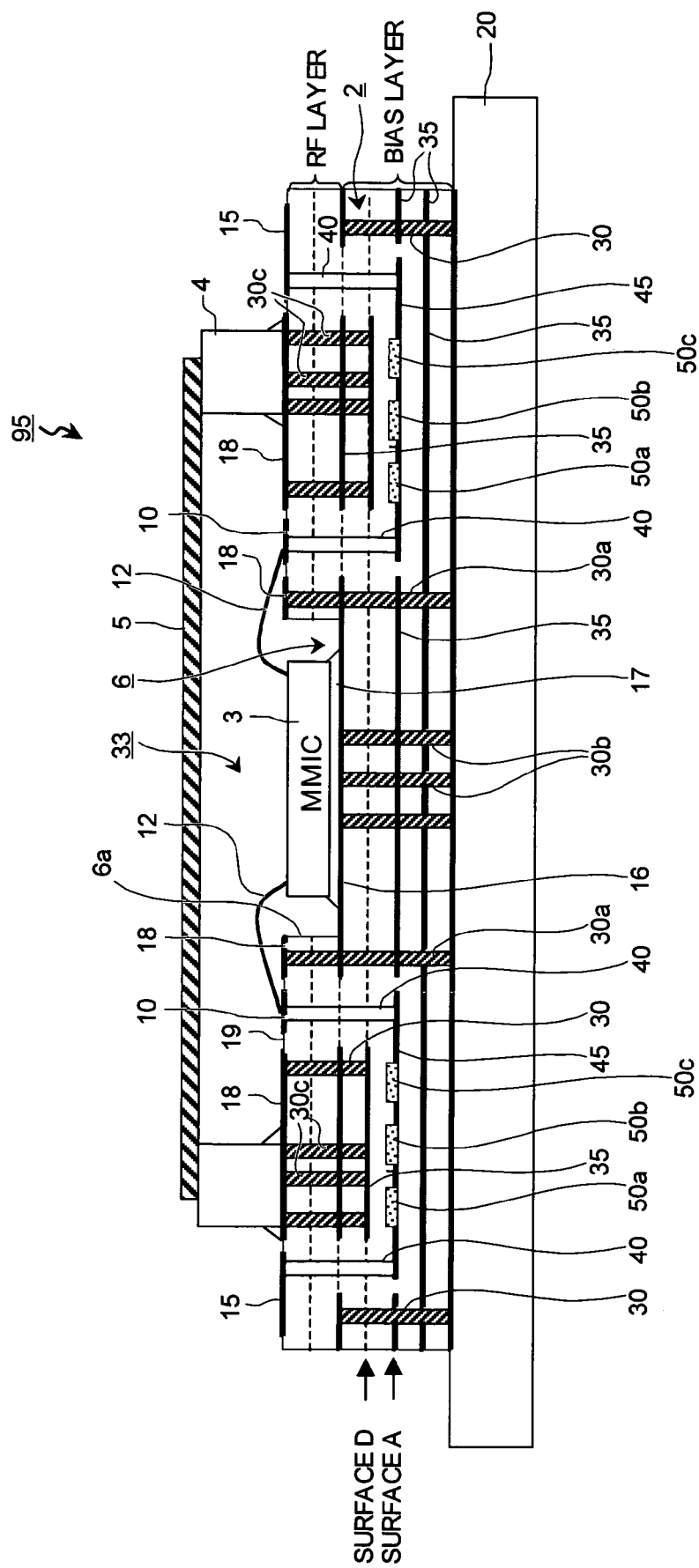
FIG. 8 is a detailed sectional view of a via structure of a multilayer dielectric substrate of a semiconductor package according to a second embodiment.

FIG. 8 is a diagram of a high-frequency package 95 according to a second embodiment. In the second embodiment, as shown in FIG. 8, a plurality of the spurious-wave suppression circuits 50 (50a to 50c) of the first embodiment are connected in cascade, thereby improving the rate of attenuation and absorption of the spurious waves.

In this case, the length of a signal line of the delay unit in each spurious-wave suppression circuit is set the same, and the spurious-wave suppression circuits 50a to 50c with the same frequency are connected in cascade. For example, a double attenuation rate can be obtained by only connecting two stages of spurious-wave suppression circuits.

When the spurious-wave suppression circuits 50a to 50c are connected in cascade, the lengths of the signal lines of the delay units 52 of the respective spurious-wave suppression circuits 50a to 50c can be varied to attenuate and absorb a plurality of different spurious frequencies. For example, in the case of in-substrate effective wavelengths $\lambda g1$, $\lambda g2$, and $\lambda g3$ of the spurious waves, the length of the signal line of the delay unit 52 of the spurious-wave suppression circuit 50a is set to $\lambda g1/2$, that of the delay unit 52 of the spurious-wave suppression circuit 50b is set to $\lambda g2/2$, and that of the delay unit 52 of the spurious-wave suppression circuit 50c is set to $\lambda g3/2$. With this, the different spurious frequencies can be attenuated and absorbed.

Third Embodiment

Figure 9:
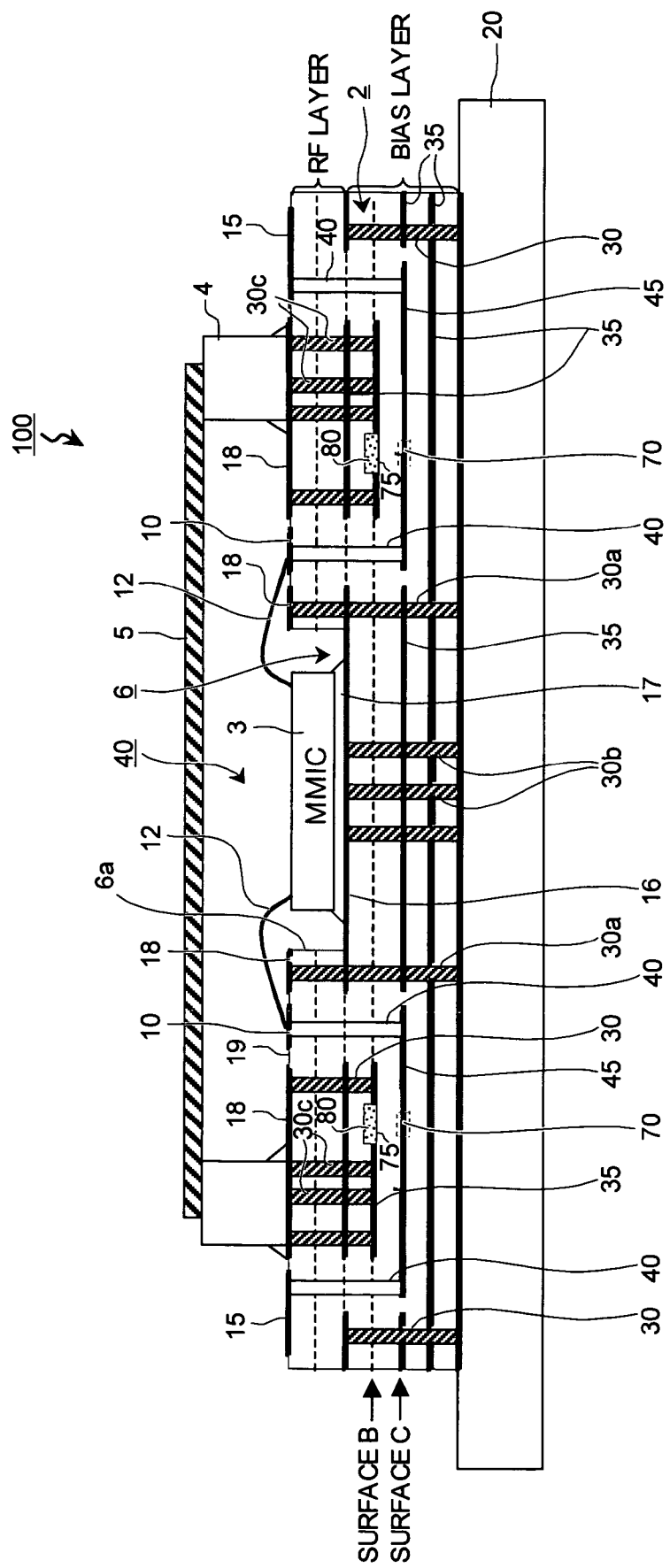
FIG. 9 is a detailed sectional view of a via structure of a multilayer dielectric substrate of a semiconductor package according to a third embodiment.
Figure 10:
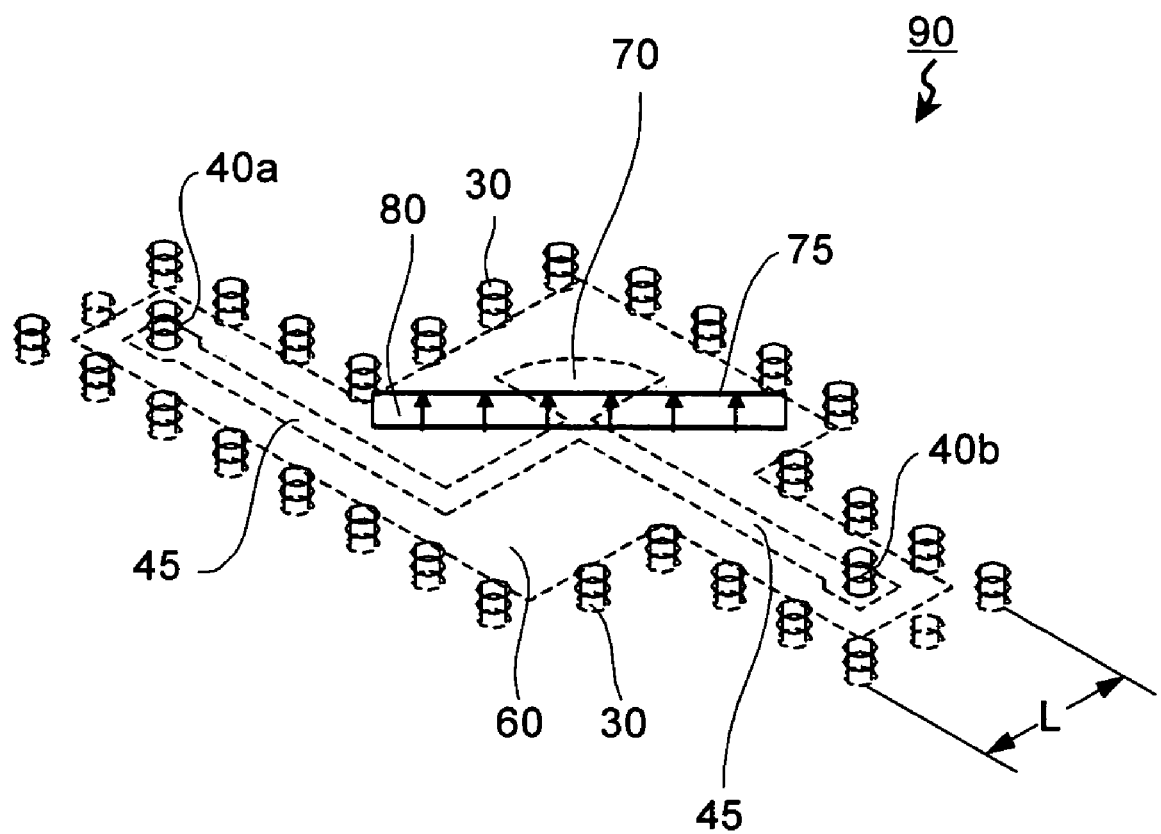
FIG. 10 is a perspective view of a structure of a spurious-wave suppression circuit according to the second embodiment mounted within the multilayer dielectric substrate.

A third embodiment according to the present invention is explained with reference to FIGS. 9 to 12. In a high-frequency package 100 according to the third embodiment, the inter-layer signal line 45 includes an open ended stub 70 with a length of one quarter of the in-substrate effective wavelength $\lambda g$ of the spurious wave as shown in FIGS. 9 and 10. A coupling slot (removed part in the inner-layer grounding conductor 35) 75 with a length one half of the in-substrate effective wavelength $\lambda g$ of the spurious wave is formed in the inner-layer grounding conductor 35 on either or both the upper and lower layers at the point where the open ended stub 70 is connected to the inner-layer signal line 45. A resistor (printed resistor) 80 is formed on the coupling slot 75. In the example of FIG. 9, the coupling slot 75 is formed on only the upper layer of the inner-layer signal line 45 on which the open ended stub 70 is formed. The resistor 80 is applied on the coupling slot 75. As explained above, spurious-wave suppression circuit 90 according to the third embodiment includes the open ended stub 70, the coupling slot 75, and the resistor 80.

Figure 11A:
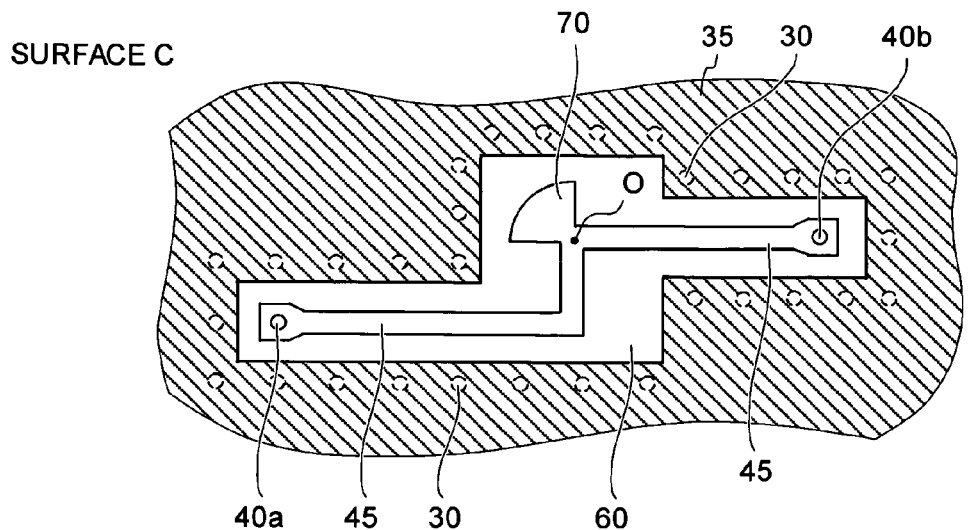
FIG. 11A is a plan view of a part of the structure of the spurious-wave suppression circuit according to the third embodiment mounted within the multilayer dielectric substrate, depicting a state of a surface C of the multilayer dielectric substrate shown in FIG. 9.
Figure 11B:
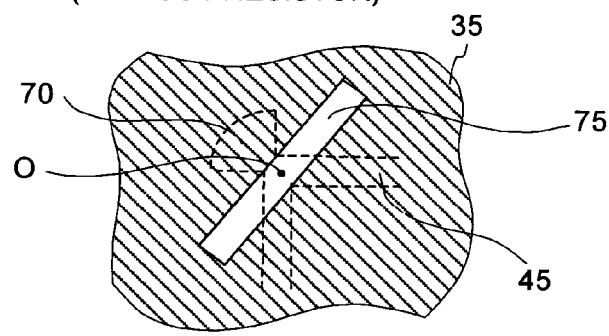
FIG. 11B is a plan view of a part of the structure of the spurious-wave suppression circuit according to the third embodiment mounted within the multilayer dielectric substrate, depicting a state (a resistor not shown) of a surface B of the multilayer dielectric substrate shown in FIG. 9.
Figure 11C:
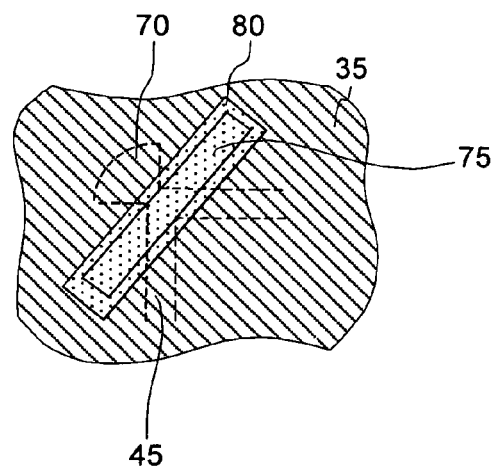
FIG. 11C is a plan view of a part of the structure of the spurious-wave suppression circuit according to the third embodiment mounted within the multilayer dielectric substrate, depicting a state (a resistor shown) of the surface B of the multilayer dielectric substrate shown in FIG. 9.

FIG. 11A is a plan view of the inner-layer signal line 45 on which is formed the open ended stub 70 arranged on a surface C (between the fourth and fifth layers) of the multi-layer dielectric substrate 2 of the high-frequency package 100 shown in FIG. 9. FIG. 11B is a plan view of the coupling slot 75 (the resistor 80 not shown) arranged on a surface B (between the third and fourth layers) of the multi-layer dielectric substrate 2. FIG. 11C is a plan view of the coupling slot 75 and the resistor 80 arranged on the surface B (between the third and fourth layers) of the multi-layer dielectric substrate 2.

In the third embodiment, the transmission line is also configured by the triplate line, and the inner-layer signal line 45 is formed between the upper and lower inner-layer grounding conductors 35. As shown in FIGS. 10 and 11A, the ground vias 30 and the inner-layer grounding conductor 35 are arranged around the inner-layer signal line 45 with the dielectric 60 therebetween. The distance between the adjacent ground vias 30 is set to equal to or less than one quarter of the in-substrate effective wavelength λg of the spurious wave. The distance L between the opposed ground vias 30 is set to equal to or less than one half of the wavelength λg.

Relevant parts of the third embodiment are explained next. First, as shown in FIGS. 10 and 11A, the open ended stub 70 with a length equal to or less than one quarter of the in-substrate effective wavelength λg of the spurious wave is connected in parallel to the inner-layer signal line 45. In this example, a radial stub is employed as the open ended stub 70. The radial stub enables a broader band compared to a normal square stub, with a line length less than λg/4, and can be miniaturized. Although, in this example, the open ended stub 70 is arranged at the corner of a crank angled at 90 degrees on the inner-layer signal line 45, it can be connected to the linear inner-layer signal line 45 at an angle of 90 degrees.

In the open ended stub 70 with a length of λg/4, with respect to the spurious wave having the wavelength λg, the distal end is an open point where the electric field is maximized, while a connection point O of the open ended stub 70 and the inner-layer signal line 45 is a short-circuit point where the electric field is minimized. As shown in FIGS. 10 and 11B, the coupling slot 75 is formed on either or both the upper and lower layers of the layer on which the open ended stub 70 is formed, so that the connection point O aligned with its center. In the high-frequency package 100 shown in FIG. 9, the coupling slot 75 is formed on only the upper layer side. In this case, the coupling slot 75 is formed to have a length one half of the in-substrate effective wavelength λg of the spurious wave and to extend to a direction perpendicular to the open ended stub 70. The coupling slot 75 is formed by removing a part from the inner-layer grounding conductor 35. With respect to the spurious wave of the wavelength λg, both ends of the coupling slot 75 become a short-circuit point where the electric field is minimized, while the center part thereof becomes an open point where the electric field is maximized. The strongest coupling can be obtained by matching the short-circuit point of the open ended stub 70 and the open point of the coupling slot 75, and the spurious wave transmitted through the inner-layer signal line 45 can be efficiently coupled to the coupling slot 75.

In other words, the coupling slot 75 is formed on the grounding conductor of either or both the upper and lower layers of the connection point of the open ended stub 70 and the inner-layer signal line 45 such that standing-wave distribution is open around this connection point and is coupled to the inner-layer signal line 45.

An electric field is formed on the coupling slot 75 to face the short direction of the coupling slot 75 as shown, and the resistor 80 arranged and applied in parallel with the electric field efficiently attenuates and absorbs the spurious wave coupled on the coupling slot 75.

As described above, according to the third embodiment, the open ended stub 70 of λg/4 and the coupling slot 75 of λg/2 on either or both the upper and lower layers thereof are arranged so that the short-circuit point of the open ended stub 70 is aligned with the open point of the coupling slot 75. With this arrangement, the coupling slot 75 efficiently couples the spurious wave transmitted through the inner-layer signal line 45. Thus, the resistor 80 arranged in parallel with the electric field formed on the coupling slot 75 can efficiently attenuate and absorb the spurious wave coupled to the coupling slot 75. Therefore, only the spurious wave can be attenuated and absorbed efficiently without affecting the transmission characteristic of the driving control signals such as the control signal, the IF signal, and the DC bias voltage. As a result, the spurious wave can be suppressed from being emitted to the outside of the high-frequency package 100, and the high-frequency package as a single unit can suppress the radiation of the high-frequency signal (spurious wave).

Although the coupling slot 75 has the strongest coupling when the coupling slot 75 is extended to a direction perpendicular to the center axis of the open ended stub 70 or the radial stub, the coupling slot 75 can be formed to extend to other directions. The coupling slot can have a length an integer times as long as λg/2. Besides, the coupling slot 75 can have a length from the connection point O to one end set to an odd number times as long as λg/4 and a length from the connection point O to the other end set to an odd number times as long as λg/4. The open ended stub 70 can have a length an odd number times as long as λg/4. Further, the resistor 80 is not necessarily applied on the entire coupling slot 75, but can be applied on one part of the slot line, so that the other part of the slot can be used to couple the spurious wave.

Figure 12:
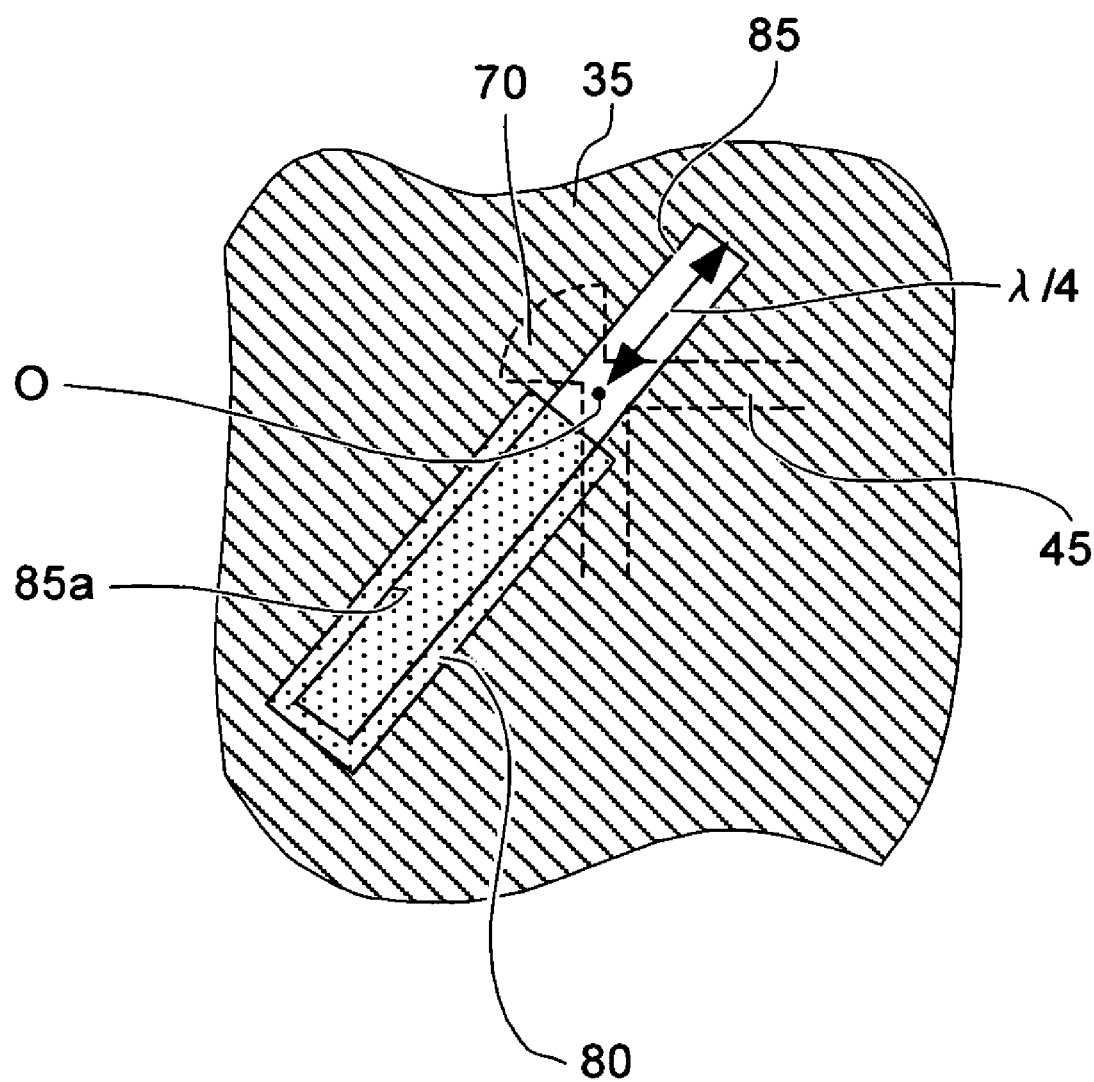
FIG. 12 is a plan view of a modification of the third embodiment.

FIG. 12 depicts a modification of the third embodiment. In this modification, a coupling slot 85 has a length, from the connection point O of the open ended stub 70 and the inner-layer signal line 45 to one end, approximately λg/4, and includes a slot line 85a extending from the connection point O to the other end with an arbitrary length. The resistor 80 is not applied on the entire coupling slot 85 but applied on only the slot line 85a side.

Also in this modification, in the open ended stub 70 with a length of λg/4, with respect to the spurious wave having the wavelength λg, the distal end is an open point where the electric field is maximized, while the connection point O is a short-circuit point where the electric field is minimized. On the other hand, with respect to the spurious wave of the wavelength λg, both ends of the coupling slot 85 are a short-circuit point where the electric field is minimized, while a point corresponding to the connection point O is an open point where the electric field is maximized. Thus, in the modification shown in FIG. 12, the short-circuit point of the open ended stub 70 and the open point of the coupling slot 85 are matched to obtain the strongest coupling.

In other words, in the modification, the spurious wave transmitted through the inner-layer signal line 45 is efficiently coupled to the coupling slot 75. Thereafter, the spurious wave is propagated to the slot line 85a so that the resistor 80 on the slot line 85a can attenuate and absorb the spurious wave.

To absorb the spurious wave, the slot line 85a is preferably long. A length from the connection point O to one end can be approximately an odd number times as long as λg/4. The resistor 80 can be applied on the entire coupling slot 85, instead of on only the slot line 85a side. In this case, a length of the open ended stub 70 can also be an odd number times as long as λg/4.

A plurality of the spurious-wave suppression circuits 90 according to the third embodiment can be connected in cascade to improve the rate of attenuation and the absorption of the spurious wave. In this case, a length of the coupling slot in each spurious-wave suppression circuit is preferably the same, and spurious-wave suppression circuits with the same frequency are connected in cascade. For example, a double absorption rate can be obtained by only connecting two stages of the spurious-wave suppression circuits. The spurious-wave suppression circuits can be connected in cascade, and the lengths of coupling slots that constitute the spurious-wave suppression circuits can be varied to be substantially one half of the in-substrate effective wavelength of the spurious waves having different frequencies. With this arrangement, the unnecessary frequencies can be attenuated and absorbed for the corresponding different frequencies.

In the embodiments described above, the present invention is applied to the high-frequency package 1 that is configured to accommodate the high-frequency device 3 in the IC-mounting recess 6 formed in the multi-layer dielectric substrate 2. However, the present invention can also be applied to the high-frequency package 1 that is configured to mount the high-frequency device 3 on a flat surface layer of the multi-layer dielectric substrate 2 having no IC-mounting recess 6.

INDUSTRIAL APPLICABILITY

As described above, the transmission line substrate and the high-frequency package according to the present invention are suitably applied to semiconductor electronic devices such as an FM-CW radar that require countermeasures against high-frequency EMI.

The invention claimed is:

1. A transmission line substrate that transmits a driving control signal input to and output from a semiconductor device, the transmission line substrate comprising a spurious-wave suppression circuit that includes
a divider that divides a signal line connected to the semiconductor device into first and second signal lines of the same phase;
a delay unit that is connected to the first signal line and includes a signal line with a length of substantially one half of an in-substrate effective wavelength of a spurious wave in a microwave band and a millimeter-wave band;
two parallel two lines that includes third and fourth signal lines in parallel, on which spurious waves are in opposite phases, the third signal line being connected to the delay unit and the fourth signal line being connected to the second signal line;
a resistor that is located on the two parallel lines and connects between the third and fourth signal lines; and
a combiner that combines the third and fourth signal lines in the same phase.

2. A transmission line substrate that transmits a driving control signal input to and output from a semiconductor device, the transmission line substrate comprising a spurious-wave suppression circuit that includes
a divider that divides a signal line connected to the semiconductor device into first and second signal lines of the same phase;
a delay unit that is connected to the first signal line and includes a signal line with a length of substantially one half of an in-substrate effective wavelength of a spurious wave in a microwave band and a millimeter-wave band;
two parallel lines that includes third and fourth signal lines in parallel, on which spurious waves are in opposite phases, the third signal line being connected to the delay unit and the fourth signal line being connected to the second signal line;
a resistor that is located on the two parallel lines and connects between the third and fourth signal lines; and
a combiner that combines the third and fourth signal lines.

3. The transmission line substrate according to claim 2, wherein the divider, the delay unit, the two parallel lines, and the combiner are configured by a triplate line including a signal line between upper and lower ground conductor layers.

4. The transmission line substrate according to claim 2, wherein
the spurious-wave suppression circuit includes a plurality of spurious-wave suppression circuits that are connected in cascade, and the delay unit includes a plurality of delay units, and
signal lines of the delay units have different lengths substantially one half of an in-substrate effective wavelength of a plurality of spurious waves having different frequencies.

5. transmission line substrate according to claim 2, wherein the signal lines are surrounded by a plurality of ground vias that are mutually spaced apart a distance equal to or less than one quarter of the in-substrate effective wavelength of the spurious wave.

6. A semiconductor package that accommodates at least one semiconductor device, the semiconductor package comprising the transmission line substrate according to claim 2 on a connection path between a driving control signal terminal of the semiconductor device and an external terminal.

7. A semiconductor package comprising:
a semiconductor device; and
the transmission line substrate according to claim 2 on a connection path between a driving control signal terminal of the semiconductor device and an external terminal.

8. A transmission line substrate that includes a transmission line for transmitting a driving control signal input to and output from a semiconductor device, and constitutes a triplate line with a grounding conductor on upper and lower layers of a signal line, the transmission line substrate comprising:
an open ended stub that is connected in parallel with the signal line and has a length of substantially one quarter of an in-substrate effective wavelength of a spurious wave in a microwave band and a millimeter-wave band;
a coupling slot that is located on the grounding conductor on at least one of the upper and lower layers at a connection point of the open ended stub and the signal line, and coupled to the signal line around the connection point where standing-wave distribution is open; and
a resistor that is located on at least a part of the coupling slot, and absorbs a normally polarized wave.

9. The transmission line substrate according to claim 8, wherein
a length from the connection point to one end of the coupling slot is substantially an odd number times as long as one quarter of the in-substrate effective wavelength of the spurious wave, and
a length from the connection point to the other end of the coupling slot is at least substantially one quarter of the in-substrate effective wavelength of the spurious wave.

10. The transmission line substrate according to claim 8, wherein
the coupling slot includes an open point that matches the connection point, and has a length of substantially one half of the in-substrate effective wavelength of the spurious wave, and
the resistor is located on the entire coupling slot.

11. The transmission line substrate according to claim 8, further comprising a plurality of spurious-wave suppression circuits that are connected in cascade, each including the open ended stub and the coupling slot,
the coupling slot including a plurality of coupling slots, wherein the coupling slots have different lengths substantially one half of an in-substrate effective wavelength of a plurality of spurious waves having different frequencies.

12. The transmission line substrate according to claim 8, wherein the signal line is surrounded by a plurality of ground vias that are mutually spaced apart a distance equal to or less than one quarter of the in-substrate effective wavelength of the spurious wave.

13. A semiconductor package that accommodates at least one semiconductor device, the semiconductor package comprising the transmission line substrate according to claim 8 on a connection path between a driving control signal terminal of the semiconductor device and an external terminal.

14. A semiconductor package comprising:
a semiconductor device; and
the transmission line substrate according to claim 8 on a connection path between a driving control signal terminal of the semiconductor device and an external terminal.

15. A transmission line substrate that includes a transmission line for transmitting a driving control signal input to and output from a semiconductor device, and constitutes a triplate line with a grounding conductor on upper and lower layers of a signal line, the transmission line substrate comprising:
a radial stub that is connected in parallel to the signal line;
a coupling slot that is located on the grounding conductor on at least one of the upper and lower layers at a connection point of the radial stub and the signal line, and coupled to the signal line around the connection point where standing-wave distribution is open; and
a resistor that is located on at least a part of the coupling slot, and absorbs a normally polarized wave.

16. The transmission line substrate according to claim 15, wherein
a length from the connection point to one end of the coupling slot is substantially an odd number times as long as one quarter of the in-substrate effective wavelength of the spurious wave, and
a length from the connection point to the other end of the coupling slot is at least substantially one quarter of the in-substrate effective wavelength of the spurious wave.

17. The transmission line substrate according to claim 15, wherein
the coupling slot includes an open point that matches the connection point, and has a length of substantially one half of the in-substrate effective wavelength of the spurious wave, and
the resistor is located on the entire coupling slot.

18. The transmission line substrate according to claim 15, further comprising a plurality of spurious-wave suppression circuits that are connected in cascade, each including the radial stub and the coupling slot, the coupling slot including a plurality of coupling slots, wherein the coupling slots have different lengths substantially one half of an in-substrate effective wavelength of a plurality of spurious waves having different frequencies.

19. The transmission line substrate according to claim 15, wherein the signal line is surrounded by a plurality of ground vias that are mutually spaced apart a distance equal to or less than one quarter of an in-substrate effective wavelength of a spurious wave.

20. A semiconductor package that accommodates at least one semiconductor device, the semiconductor package comprising the transmission line substrate according to claim 15 on a connection path between a driving control signal terminal of the semiconductor device and an external terminal.

21. A semiconductor package comprising:
a semiconductor device; and
the transmission line substrate according to claim 15 on a connection path between a driving control signal terminal of the semiconductor device and an external terminal.

\* \* \* \* \*